United States Patent
Cherubini

(10) Patent No.: US 7,405,678 B2
(45) Date of Patent: Jul. 29, 2008

(54) METHOD OF RETRIEVING DATA FROM A STORAGE DEVICE USING A RECOVERED READ-BACK PARAMETER

(75) Inventor: Giovanni Cherubini, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/534,702

(22) Filed: Sep. 25, 2006

(65) Prior Publication Data

US 2008/0074300 A1 Mar. 27, 2008

(51) Int. Cl.
*H03M 7/00* (2006.01)
(52) U.S. Cl. .......................................... 341/51; 341/50
(58) Field of Classification Search ............... 341/50–70
See application file for complete search history.

(56) References Cited

U.S. PATENT DOCUMENTS

| | | | | |
|---|---|---|---|---|
| 5,475,388 A | * | 12/1995 | Gormish et al. ............. | 341/107 |
| 5,706,313 A | * | 1/1998 | Blasiak et al. ............. | 375/330 |
| 6,313,963 B1 | * | 11/2001 | Hsieh ............................ | 360/46 |
| 6,668,349 B1 | * | 12/2003 | Sawaguchi .................... | 714/755 |
| 2005/0046602 A1 | | 3/2005 | Hayami | |
| 2005/0066261 A1 | | 3/2005 | Morita et al. | |
| 2007/0041115 A1 | * | 2/2007 | Lee .............................. | 360/31 |

* cited by examiner

*Primary Examiner*—Lam T Mai
(74) *Attorney, Agent, or Firm*—Daryl Neff; Eustus Nelson

(57) ABSTRACT

A storage device comprising a modulation encoder and decoder, an error-correction encoder and decoder, and a metric computation module. The modulation encoder and decoder provide a modulation code for data stored on the storage device. The error-correction encoder and decoder provide an error-correcting code for data to be written on the storage device. The metric computation module is coupled with the modulation decoder to compute conditional probabilities using recovered read-back channel parameters of the storage device.

8 Claims, 7 Drawing Sheets

METHOD OF RETRIEVING DATA FROM A STORAGE DEVICE USING A RECOVERED READ-BACK PARAMETER

FIELD OF THE INVENTION

The present invention relates to a storage device. In particular, the present invention relates to read-back of stored data in the presence of read-back channel impairments from such a storage device.

BACKGROUND OF THE INVENTION

A wide variety of data storage devices are used today. Some examples include magnetic recording devices such as hard disk drives (HDD) and digital linear tapes (DLT), and optical storage devices such as compact disks (CD) and digital versatile disks (DVD). Based on the developments of the atomic force microscope (AFM), new probe based storage concepts have been introduced over the past few years. Probes having a nanoscale tip have been used for modifying the topography and for scanning an appropriate storage medium. Data are written as sequences of symbols represented by topographical marks, such as indentation marks and non-indentation marks. The tips comprise apexes with a radius in the nanometer range, and the indentation marks have a comparable diameter, for example, a diameter in the range of 20 to 30 nm or even smaller. Hence, these data storage concepts promise ultra-high storage area density.

A storage device for storing data based on the AFM principle is disclosed in "The millipede—more than 1,000 tips for future AFM data storage" by P. Vettiger et al., IBM Journal Research Development, Vol. 44, No. 3, March 2000. The storage device has a read function and a write function based on the mechanical scanning of a storage medium with an array of probes each having a tip. For this purpose, the probes comprise cantilevers that carry the sharp tips on their end sections. Symbols are represented by indentation marks and non-indentation marks in a polymer layer. The probes respond to these topographic changes while they scan the surface of the polymer medium.

Indentation marks are formed on the polymer medium by thermomechanical recording. Writing of an indentation mark is achieved by applying a voltage pulse across two of the cantilever terminals to heat a write heater and tip and, simultaneously, another voltage pulse to the substrate of the polymer medium to create a local force between tip and medium. As a result, a nanometer-sized indentation is formed on the medium, representing an encoded '1' symbol. The absence of an indentation at the position of a topographical mark represents an encoded '0' symbol.

Reading is also accomplished by a thermomechanical concept. A voltage is applied across two of the cantilever terminals, so that a read heater heats up to a temperature that is not high enough to soften the polymer layer as is necessary for writing. The thermal sensing is based on the fact that the thermal conductance between the probe and the storage medium changes when the probe tip is moving in an indentation, as the heat transport is in this case more efficient. As a consequence of this, the temperature of the cantilever decreases and hence also its resistance decreases. This change of resistance is then measured and determines the read-back signal. Reading and also writing the marks is accomplished by moving each probe relative to the storage medium along a line representing a track. The amplitude of a read-back signal is defined as the difference in magnitude between a read-back signal sample that is obtained when the tip of the probe is exactly at an indentation center, and a sample obtained when the tip of the probe is at an indentation-free area of the storage medium, while the probe moves along a track center line. This is also disclosed in "Millipede—a MEMS based Scanning-Probe Data-Storage System", by E. Eleftheriou et al., IEEE Transactions on Magnetics 39(2), March 2003, pp. 938-945, and in "Signal Processing for Probe Storage," by H. Pozidis et al., Proceedings of International Conference on Acoustics, Speech and Signal Processing, Philadelphia, Pa., Mar. 19-23, 2005, pp. 745-748.

The reliability of data retrieval in data storage devices may be improved by employing modulation codes to constrain the sequences that are written on the storage medium. The most popular modulation codes used in conventional data storage devices are the run length limited (RLL) codes. RLL codes are characterized by two parameters, d and k, whereby '1' symbols are constrained to be separated by at least d and at most k '0' symbols. It is customary to refer to RLL codes as (d, k)-constrained codes. Writing at least d '0's between '1's allows to increase the linear recording density by mitigating intersymbol interference, whereas limiting to k the maximum number of consecutive '0's ensures that feedback is provided sufficiently often for timing recovery and gain control loops.

Further, the process of recording and subsequent retrieval of data is likely to introduce errors in the recovered data. These errors are typically related to electronics noise, imperfections in the storage medium surface, and non-ideal recovery of channel parameters during the write and read processes. Errors in the recovered data are corrected using error-correcting codes (ECC). Error-correcting codes add redundancy to the information bits during the encoding operation. This redundancy can be used to correct errors in the recovered data during read operations. Some commonly used ECC for data storage applications are the low-density parity-check (LDPC) codes and the Reed-Solomon (RS) codes. Various decoding algorithms for LDPC codes for practical implementations are known. One such decoding algorithm is disclosed in "Reduced-Complexity Decoding of LDPC Codes", by J. Chen et al., IEEE Transactions on Communications 53(8), August 2005, pp. 1288-1299. To enhance error-correction capabilities and capacity of the device, ECC is usually implemented jointly with data interleaving and RLL (d,k) coding. In this case it is customary to refer to the ECC as the outer code and to the RLL code as the inner code. The data-retrieval process involves making binary hard (threshold) decisions on the read-back channel-output signals, using the detected binary symbols to decode the (d,k) sequences, deinterleaving the (d,k)-decoder binary output symbols to get channel-output codewords for error-correction, and finally decoding the codewords to retrieve the user information bits.

Besides electronics noise and media noise, other impairments that are present in the read-back signal of a recording channel are, for example, random fluctuations of the read-back signal amplitude, and direct-current (DC) offset of the read-back signal. Further, random fluctuations of the time instants at which pulses are applied for writing information on the storage medium, or at which sampling of the read-back signal for conversion from the analog domain to the digital domain takes place, further impair the quality of the read-back signal. The phenomenon of random fluctuations in the timing of the write and read processes is usually known as jitter. In the data-retrieval process described above, making binary hard decisions leads to non-recoverable loss of information. Moreover, hard-decision decoding of the RLL (d, k) sequences introduces error propagation. Furthermore, a hard-decision scheme does not allow iterative soft decoding of an outer error-correcting code. However, conventional soft decoding techniques, as for example proposed for modulation codes in HDD, do not take into account in the decoding process the presence of such channel impairments as jitter, gain fluctuations, offsets, and nonlinear distortion. Timing recovery, gain adjustment, and offset compensation are performed prior to decoding, and the statistical description of related read-back channel impairments is not exploited. A further drawback of the conventional schemes when applied to a probe storage device is that, in the presence of channel impairments such as random variations in read-back signal amplitude, random variations in sampling instants (jitter), and residual DC offset, the probability of a binary decision error when reading a '1' may be significantly larger than the probability of a binary decision error when reading a '0'.

Thus, there is a need for a decoder for the inner code, to obtain near-optimum soft decoding in the presence of random channel impairments without increasing the number of states in the inner decoder, and hence without increasing decoder complexity.

SUMMARY OF THE INVENTION

According to an embodiment of the present invention, there is provided a storage device comprising a modulation encoder and decoder, an error-correction encoder and decoder, and a metric computation module. The modulation encoder and decoder provide a modulation code for data stored on the storage device. The error-correction encoder and decoder provide an error-correcting code for data to be written on the storage device. The metric computation module is coupled with the modulation decoder and computes conditional probabilities using recovered read-back channel parameters of the storage device.

In another embodiment of the present invention, there is provided a method of data retrieval from a storage device. The method includes obtaining samples of a read-back signal from the storage device, computing conditional probabilities of the read-back signal samples using at least one recovered read-back channel parameter of the storage device, performing decoding of the modulation code using the conditional probabilities to obtain a posteriori probabilities, and performing decoding of the error-correcting code using the a posteriori probabilities to obtain an estimate of the recorded message.

DETAILED DESCRIPTION

The present invention is directed to the problem of data retrieval in storage devices. Various embodiments of the present invention provide systems and methods for probabilistic data retrieval in storage devices. Further, various embodiments of the present invention provide for considering read-back channel parameters of the storage device during data retrieval. The invention provides a method and apparatus to determine a posteriori probabilities of the binary symbols that are output by the decoder of an inner modulation code. The a posteriori probabilities may be employed by a soft decoder of an outer error-correcting code to estimate the bits of the recorded information message.

Figure 1:
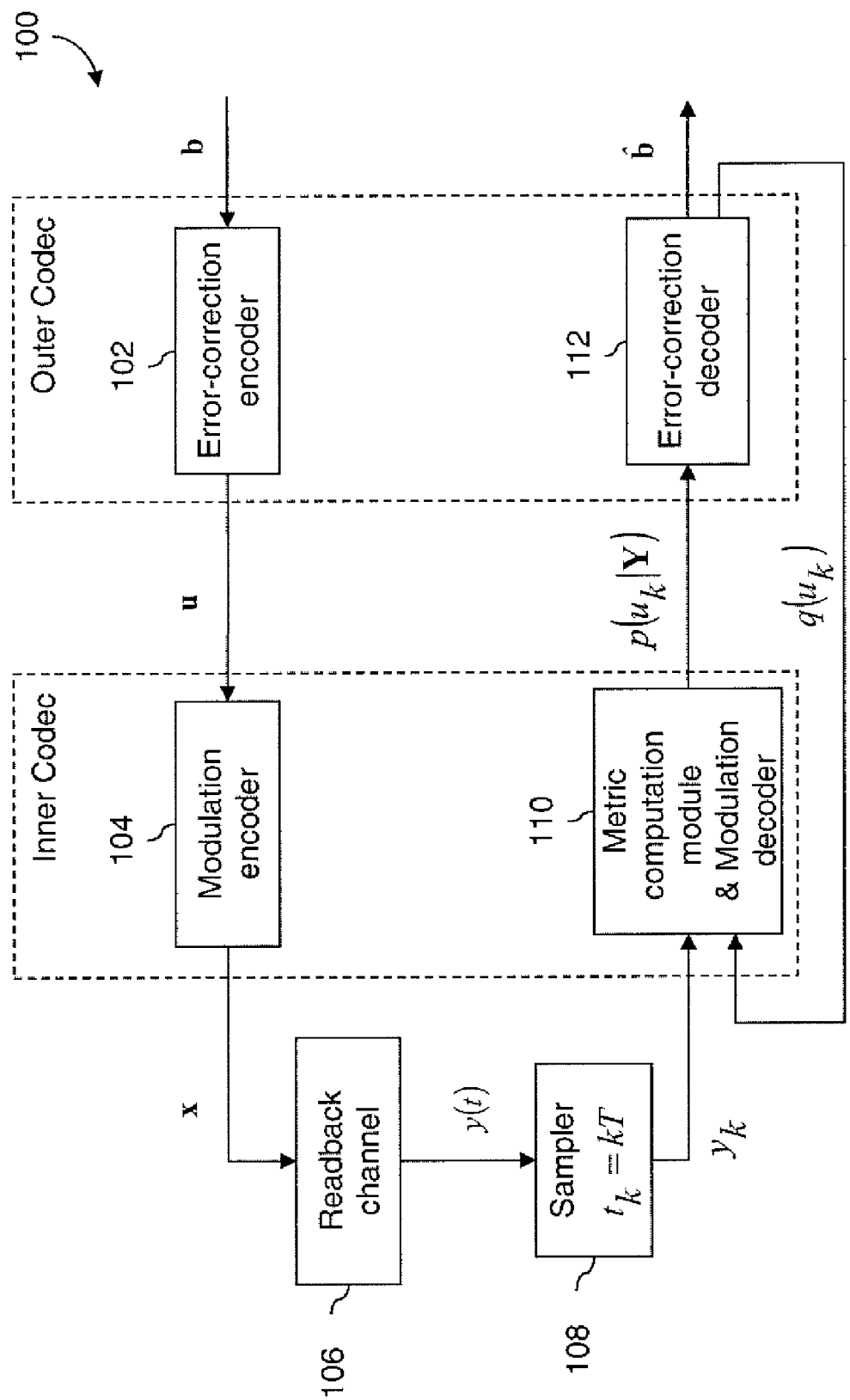
FIG. 1 is a block diagram depicting a storage device in accordance with an embodiment of the present invention.

FIG. 1 is a block diagram depicting a storage device in accordance with an embodiment of the present invention. The data to be stored on the storage device is represented by a vector of message bits b. The figure shows message bits b fed to an error-correction encoder 102. Error-correction encoder 102 encodes message bits b using an error-correcting code to obtain a sequence of codewords, where an individual codeword is represented by the vector u. In various embodiments of the present invention, the error-correcting code could be, by way of non-limiting example, a low-density parity-check (LDPC) code or a Reed-Solomon (RS) code. In general, any linear block or convolutional error-correcting code may be applied as an outer code to the present invention.

Further, the encoded binary symbols of codeword u are then fed to a modulation encoder 104. Modulation encoder 104 encodes codeword u using a modulation code. The modulation code could be, by way of non-limiting example, a run-length limited (RLL) code. In general, any modulation code that is generated by an encoder having a finite-state machine representation may be applied as an inner code to the present invention. Modulation encoder 104 encodes codeword u to obtain a sequence of binary write-symbols x for writing onto the storage medium.

The sequence of write-symbols x is written onto the storage medium of the storage device (not shown in FIG. 1). The storage medium may include, without limitation, a magnetic medium such as a hard disk or a digital linear tape (DLT), an optical medium such as a compact disk (CD) or a digital versatile disk (DVD), or a storage medium for probe-based recording.

Through the data writing and retrieval processes, write-symbols x are transformed into a read-back signal y(t), where the notation y(t) denotes the analog nature of the signal. Read-back signal y(t) is affected by various factors such as thermal noise, media noise, and non-ideal recovery of channel parameters during the write and read processes. These transformations are modeled herein as a read-back channel 106. Read-back channel 106 may introduce random variations such as jitter, direct current (DC) offset, and amplitude variations through the writing and reading-back of the sequence of write-symbols x. These variations are characteristics of read-back channel 106, and are modeled using the following relation:

$$y(t) = A(t) \sum_{k} x_k z(t - kT - j_k) + h(t) + w(t) \quad (1)$$

where
  y(t) is the read-back signal from read-back channel 106,
  A(t) is a random process modeling the signal amplitude, $x_k$ is the binary write-symbol at the k-th symbol interval, z(t) is the read-back signal pulse, T is the duration of the symbol interval, $j_k$ is the random jitter affecting the read-back pulse at the k-th symbol interval, h(t) is a random process modeling the DC-offset, and w(t) is additive white Gaussian noise.

Read-back signal y(t) is sampled by a sampler 108 at a sampling interval of T, to obtain read-back data $y_k$. While various embodiments of the present invention are described to use a sampling interval equal to the duration of the symbol interval for the recovery of read-back channel parameters, it would be apparent to a person skilled in the art that various embodiments of the present invention may use oversampling of the read-back signal, whereby more than one sample per symbol interval is provided by the sampler. The sequence of read-back signal samples $Y=\{y_k\}$ is fed to a metric computation and modulation decoder (MCMD) 110, for soft decoding of the modulation code. MCMD 110 performs soft-decoding of read-back signal samples $\{y_k\}$ to obtain a posteriori probabilities $p(u_k|Y)$. In various embodiments of the present invention, a posteriori probabilities $p(u_k|Y)$ are computed by the soft modulation decoder using the conditional probabilities of the signal samples as a metric. The conditional probabilities of the signal samples are provided by a metric computation module taking into account the relation above and the recovered channel parameters. In an embodiment, the conditional probabilities are computed using the following relation:

$$p(y_k|x_k) = \frac{1}{(2\pi\sigma^2)^{1/2}} \exp\left[-\frac{\min(y_k - (x_k(A \pm \Delta A)z(\pm \Delta j) \pm \Delta h))^2}{2\sigma^2}\right] \quad (2)$$

where $x_k$ is the hypothesized symbol input to the channel at the $k^{th}$ symbol interval, $\sigma$ is the standard deviation of an additive white Gaussian noise sample, $\Delta A$ is the standard deviation of amplitude fluctuations around a nominal value A, $\Delta j$ is the standard deviation of jitter, $\Delta h$ is the standard deviation of DC offset.

MCMD 110 feeds a posteriori probabilities $p(u_k|Y)$ to error-correction decoder 112. Error-correction decoder 112 performs decoding of the error-correcting code using a posteriori probabilities $p(u_k|Y)$ to obtain a vector $\hat{b}$, which is an estimate of the vector of message bits b. Further, if the error-correction decoder is a soft decoder, refined values of the a posteriori probabilities $q(u_k)$ may be fed back to the MCMD 110. Iterative decoding may thus take place, whereby the MCMD 110 further updates the a posteriori probabilities $p(u_k|Y)$, based on the refined a posteriori probabilities $q(u_k)$.

In various embodiments, data may be interleaved before the write operation, and subsequently deinterleaved in the read-back operation to improve system performance. In many such embodiments, interleaving and deinterleaving functions are customarily introduced between outer and inner encoders and decoders in serially concatenated coding schemes. In an embodiment, codewords u may be fed to an interleaver (not shown in FIG. 1), and the interleaver output may be fed to modulation encoder 104. In this embodiment, a deinterleaver is correspondingly introduced between MCMD 110 and error-correction decoder 112.

We now describe a further embodiment of the present invention using a low-density parity-check (LDPC) code as the error-correcting code, and a run-length limited (RLL) code as the modulation code. This embodiment is introduced as an example to illustrate the functioning of the present invention with the LDPC code and the RLL code, and is not intended to limit the invention. It will be apparent to one skilled in the art that the principles and teachings of the present invention may be applied to various combinations of an error-correcting code and a modulation code, without deviating from the spirit and scope of the present invention.

In the embodiment presented hereinafter, the forward-backward algorithm is used for RLL decoding and the sum-product algorithm is used for LDPC decoding. Both the forward-backward algorithm and the sum-product algorithm may be regarded as variants of a probability propagation algorithm. The forward-backward algorithm is performed by using the conditional probabilities of the read-back signal samples that are provided by a metric computation module. The a posteriori probabilities obtained by the soft modulation decoder are input to the LDPC decoder to enable soft decoding. A posteriori probabilities may be iteratively computed by iteratively applying the forward-backward algorithm for decoding of the RLL code and the sum-product algorithm for decoding of the LDPC code.

An LDPC code may be defined by a pair of matrices, called the generator matrix G and the parity-check matrix H, used in the encoding and decoding operations respectively. LDPC codes are a family of linear block codes with the parity-check matrix H containing mostly zeros and only a small number of ones. The sparsity of the parity-check matrix H defining these codes enables their efficient decoding by a message-passing procedure also known as the sum-product algorithm, described later in this document. In an LDPC code, the generator matrix G and parity-check matrix H satisfy the following relation:

$$H \cdot G^T = 0 \quad (3)$$

where

G is the generator matrix of the LDPC code,

H is the parity-check matrix of the LDPC code, 0 is the null matrix of appropriate dimensions, and $G^T$ denotes the transpose of the generator matrix.

LDPC encoding is performed by multiplying a vector of message bits b by the generator matrix G of the LDPC code, represented mathematically as:

$$u^T = b^T \cdot G \quad (4)$$

where

G is the generator matrix of the LDPC code, $b^T$ is the transposed vector of message bits b, and $u^T$ is the transposed vector representing the binary codeword u.

In this embodiment the length of the binary codeword u is $n_0=2N$, where N is a positive integer number. Further, as described with reference to FIG. 2, N is the number of steps required for an RLL encoder to generate a sequence of write-symbols x from a codeword u of length $n_0=2N$. The symbols of the codeword u thus obtained are further encoded using an RLL encoder to generate the sequence of write-symbols x.

Figure 2:
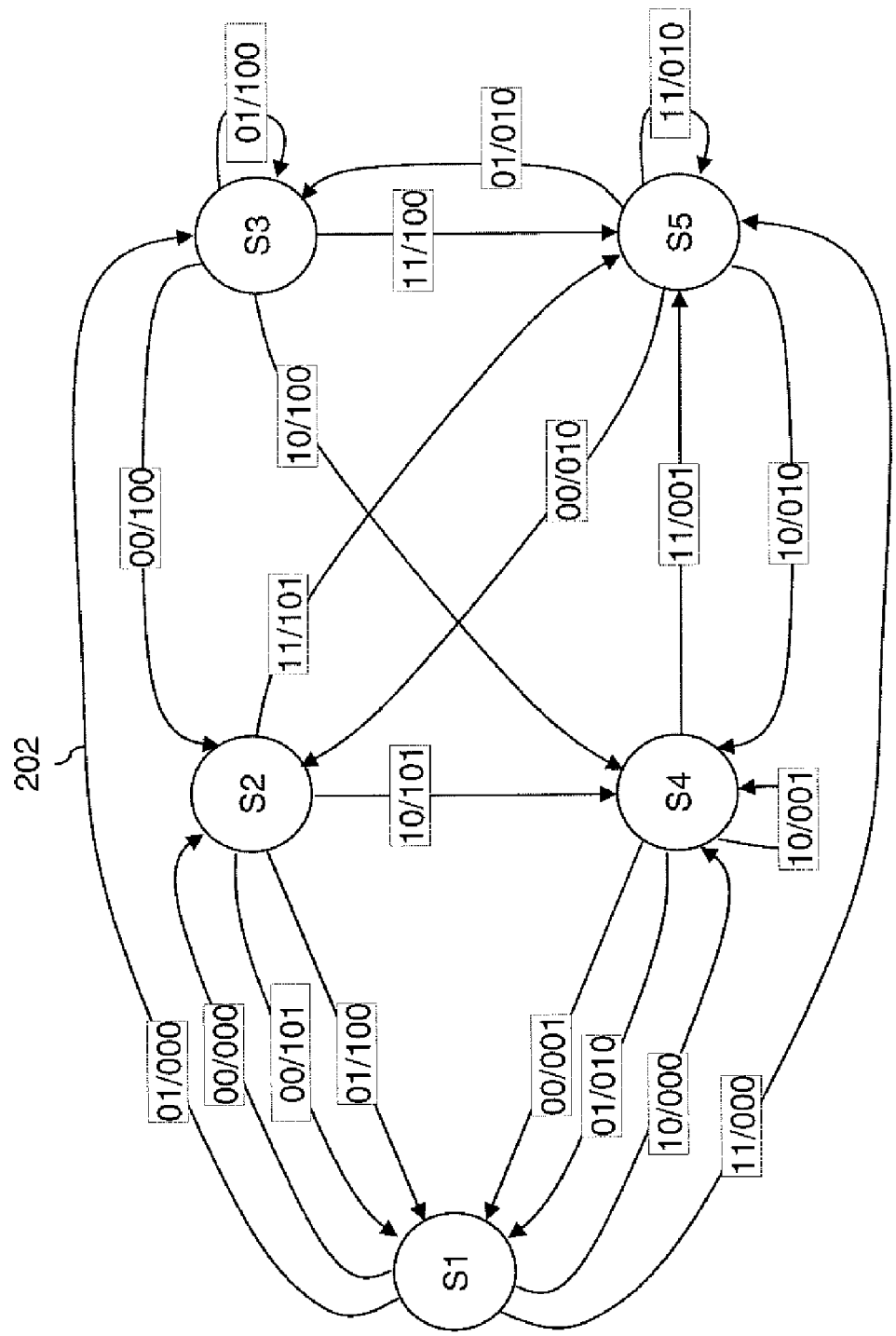
FIG. 2 shows the transition diagram of a 5-state rate-⅔ encoder for RLL (1, 7) sequences.

FIG. 2 shows the state-transition diagram of a 5-state rate-⅔ encoder for RLL (1, 7) sequences. The five states are depicted as nodes S1, S2, S3, S4 and S5. Further, state transitions are depicted using arrows. A label is associated with each state transition in the figure. The label comprises a two bit number followed by a '/' and a three bit number. The two bit number represents the two codeword symbols that are input to the RLL encoder. These codeword symbols determine the transition from the current encoder state to the next encoder state. Further, the three bit number represents the three symbols that are output by the RLL encoder in correspondence with that transition.

For example, a transition 202 is shown between S1 and S3 depicts that if the RLL encoder receives codeword symbols '01' while in S1, the RLL encoder will output the symbols '000' and move to S3. Note that N steps are required for the RLL encoder to generate a sequence of write-symbols x from a codeword u of length 2N.

The write-symbols output by the RLL encoder are then written onto the recording medium during the write process. Subsequently, during the read-back operation, read-back channel 106 provides the read-back signal y(t) representing the sequence of write-symbols x. Sampler 108 samples the read-back signal y(t) to obtain the sequence of read-back samples $Y=\{y_k\}$.

Soft decoding of the RLL (1,7)-constrained sequence is performed on the sequence of read-back signal samples $\{y_k\}$. A posteriori probabilities $p(u_k|Y)$ are obtained using the forward-backward algorithm.

Figure 3:
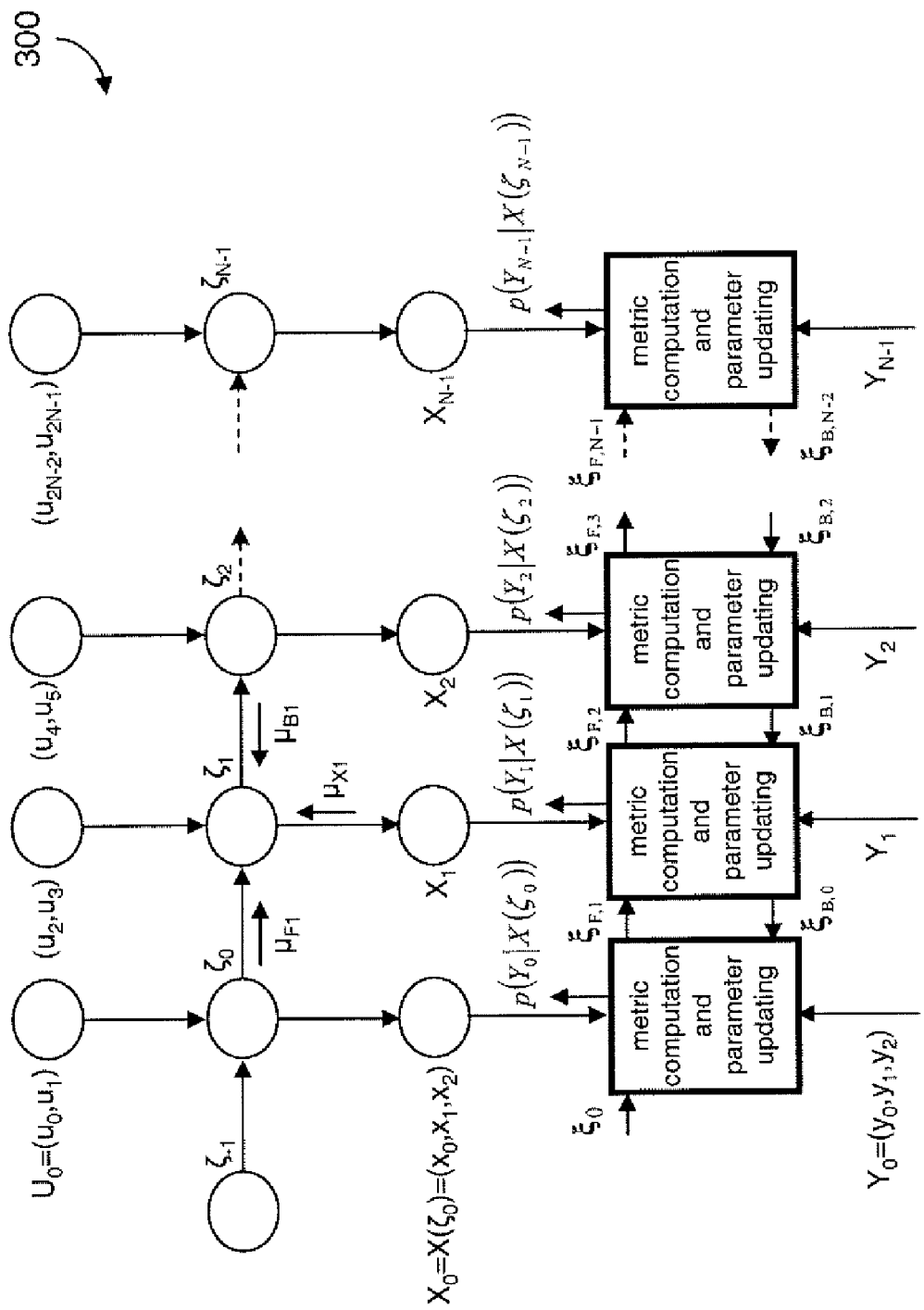
FIG. 3 shows a block diagram depicting an RLL decoder with a metric computation and parameter updating unit, in accordance with an embodiment of the present invention.

FIG. 3 shows a block diagram depicting an RLL decoder with a metric computation and parameter updating unit, in accordance with an embodiment of the present invention. Feedback from the LDPC decoder to the RLL decoder is given by the refined a posteriori probabilities of the encoded LDPC symbols that are computed by a soft LDPC decoder. While various embodiments of the present invention have been described to use a feedback of the a posteriori probabilities from the LDPC decoder to the RLL decoder, it would be apparent to a person skilled in the art that various embodiments of the present invention may use a soft LDPC decoder that generates an estimate of the message bits without iteratively exchanging a posteriori probabilities with the soft decoder of the inner code. Further embodiments of the present invention may include a different outer code than an LDPC code, for example an RS code. If the decoder of the outer code is a hard decoder, the a posteriori probabilities output by the soft decoder of the inner code are employed to provide maximum a posteriori probability (MAP) decisions to the decoder of the outer code.

For iterative decoding of the RLL code, in the first iteration no prior knowledge about the symbols of the codeword u is available, therefore equally likely codeword symbols are assumed. As state transitions in the generation of a rate-⅔ RLL code are determined by pairs of symbols, this is expressed by the following relation:

$$p(u_{2i} = \beta_0, u_{2i+1} = \beta_1) = \frac{1}{4}, \quad (5)$$

$$\beta_0, \beta_1 \in \{0,1\}$$

where $u_{2i}$ denotes the $(2i)^{th}$ symbol of the codeword u, $u_{2i+1}$ denotes the $(2i+1)^{th}$ symbol of the codeword u, $p(u_{2i}=\beta_0, u_{2i+1}=\beta_1)$ denotes the probability that the $(2i)^{th}$ and $(2i+1)$ of the codeword u at the $i^{th}$ stage are equal to $\beta_0$ and $\beta_1$, respectively.

In the subsequent iterations, the probabilities of the encoded LDPC symbols are set equal to the a posteriori probabilities computed by the LDPC decoder, as $$p(u_{2i}=\beta_0, u_{2i+1}=\beta_1)=q(u_{2i}=\beta_0)q(u_{2i+1}=\beta_1), \beta_0, \beta_1 \in \{0,1\} \quad (6)$$

where $q(u_{2i}=\beta_0)$ denotes the a posteriori probability of the $(2i)^{th}$ symbol of codeword u being $\beta_0$, and $q(u_{2i+1}=\beta_1)$ denotes the a posteriori probability of the $(2i+1)_t$ symbol of the codeword u being $\beta_1$.

Various embodiments of the present invention use a description of the read-back channel parameters to compute the metric for soft decoding of the inner code. In an embodiment of the present invention, the description of the channel parameters is assumed to be fixed during the decoding process. In another embodiment, the description of the channel parameters is updated during the decoding process. Various algorithms may be considered for updating the description of the channel parameters, e.g., the least-mean squares algorithm or the recursive least squares algorithm.

A read-back channel where the only non-negligible impairment is represented by random fluctuations of the read-back signal amplitude is considered hereinafter to illustrate embodiments of the present invention, and should not be construed as limiting to the scope of the present invention. In this example, the conditional probabilities provided by the metric computation module are given by:

$$p(y_k|x_k) = \frac{1}{(2\pi\sigma^2)^{1/2}} \exp\left[-\frac{(y_k - A_k x_k)^2}{2\sigma^2}\right] \quad (7)$$

where $A_k$ represents the recovered signal amplitude. The value of $A_k$ is updated at each symbol interval using the following relation:

$$A_{k+1}=A_k+\hat{x}_k\alpha_A(y_k-A_k\hat{x}_k) \quad (8)$$

where $\alpha_A$ denotes a positive adaptation gain, and $\hat{x}_k$ is a tentative threshold decision on the written symbol $x_k$, obtained as: $\hat{x}_k=0$ if $y_k<A_k/2$, else $\hat{x}_k=1$.

Note that in this embodiment $\xi_{F,i}=\xi_{B,i-1}=A_{3i}$. The elements of the vector $\xi_{F,i}$ are the recovered channel parameters that are passed to the i-th decoder stage from the (i−1)-th decoder stage, whereas the elements of the vector $\xi_{B,i}$ are the recovered channel parameters that are passed to the i-th decoder stage from the (i+1)-th decoder stage. In general, different subscripts F and B characterize the vector of channel parameters $\xi$, as the information about the RLL code sequence that is collected during the execution of the forward-backward algorithm may also be used to refine the description of the channel parameters. For example, as amplitude fluctuations affect the read-back signal only if a symbol equal to '1' is written on the storage medium, one might decide to update the recovered amplitude value only if the probability that a read-back sample corresponds to a written symbol equal to '1' is sufficiently large.

The number of channel parameters that might be considered for the metric computation is not limited to amplitude, DC offset, and jitter. For example, nonlinear distortion may be included in the metric computation. Also note that the metric in (7) employs a recovered channel parameter that is updated at each symbol interval. On the other hand, the worst-case metric computation reported on relation (2) uses a statistical description of channel parameters and hence represents a preferred embodiment for a simplified decoding algorithm, but other embodiments are possible. For example, if the description of channel parameters is given by the probability distribution of the parameters, an average metric may be employed, where the averaging is performed over the distribution of the channel parameters.

In the RLL decoder, N state variables are maintained for the RLL decoding process. Each state variable $\zeta_i$, i=0, ... ,N−1, contains a copy of the current pair of codeword symbols. Thus, each state variable can be interpreted as a five-bit binary number, whose two least significant bits (LSB) are a copy of the current pair of codeword symbols, and whose three most significant bits (MSB) represent the current RLL encoder state. Let $\zeta_i/4$ be the binary number obtained by cutting off the two LSB of $\zeta_i$, and let $\zeta_i \% 4$ be the value of the two LSB of $\zeta_i$. Let $f(\zeta_{i-1})$ be the three-bit binary number representing the new state variable at the $i^{th}$ stage, excluding the pair of codeword symbols $(u_{2i}, u_{2i+1})$. Also let $g(\zeta_i)$ be the three-bit RLL encoder output corresponding to the state variable $\zeta_i$.

We can now specify the relevant probabilities for the RLL decoder. The state transition probabilities are:

$$p(\zeta_i|\zeta_{i-1}, u_{2i}, u_{2i+1}) = \delta(\zeta_i|4, f(\zeta_{i-1}))\delta(\zeta_i\%4, (u_{2i}, u_{2i+1})) \\ p(u_{2i}, u_{2i+1}) \text{ for } i=0, \ldots, N-1 \quad (9)$$

where $\delta(i,j) = \{1 \text{ if } i=j, \text{ and } 0 \text{ otherwise}\}$, and it is assumed $\zeta_{-1}=0$ to initialize the decoder.

The probabilities of triplets of RLL encoder output binary symbols are:

$$p(x_{3i}, x_{3i+1}, x_{3i+2}|\zeta_i) = \delta(g(\zeta_i), (x_{3i}, x_{3i+1}, x_{3i+2})) \text{ for } \\ i=0, \ldots, N-1 \quad (10)$$

Using the conditional probabilities provided by the metric computation modules, given by $p(y_{3i}, y_{3i+1}, y_{3i+2}|x_{3i}, x_{3i+1}, x_{3i+2}) = p(y_{3i}|x_{3i})p(y_{3i+1}|x_{3i+1})p(y_{3i+2}|x_{3i+2})$, the probability messages propagated by the forward-backward algorithm are given by:

$$\mu_{F_{i+1}} = \sum_{\zeta_i} \delta(\zeta_{i+1}/4, f(\zeta_i))\delta(\zeta_i\%4, (u_{2i}, u_{2i+1}))p(u_{2i}, u_{2i+1})\delta(g(\zeta_i), \\ (x_{3i}, x_{3i+1}, x_{3i+2})) \times p(y_{3i}, y_{3i+1}, y_{3i+2}|x_{3i}, x_{3i+1}, x_{3i+2})\mu_{F_i} \quad (11)$$

$$\mu_{X_i} = \delta(g(\zeta_i), (x_{3i}, x_{3i+1}, x_{3i+2}))p(y_{3i}, y_{3i+1}, y_{3i+2}|x_{3i}, x_{3i+1}, x_{3i+2})\mu_{F_i} \quad (12)$$

$$\mu_{B_i} = \sum_{\zeta_{i+1}} \delta(\zeta_{i+1}/4, f(\zeta_i))\delta(\zeta_{i+1}\%4, (u_{2i+2}, u_{2i+3}))p(u_{2i+2}, u_{2i+3}) \times \\ \delta(g(\zeta_{i+1}), \\ (x_{3i+3}, x_{3i+4}, x_{3i+5}))p(y_{3i+3}, y_{3i+4}, y_{3i+5}|x_{3i+3}, x_{3i+4}, x_{3i+5})\mu_{B_{i+1}} \quad (13)$$

The initialization/boundary constraints for the forward-backward algorithm are given by $\mu_{F_{-1}} = \{1 \text{ if } \zeta_{-1}=0, \text{ and } 0 \text{ otherwise}\}$, and $\mu_{B_N}$=constant. Finally, the a posteriori probabilities are computed by the soft RLL decoder as follows:

$$p(u_{2i} = \beta_0|Y) = \quad (14)$$

$$\eta_i \sum_{m \in \{0,1\}} \sum_{\zeta_i} \delta(\zeta_i\%4, \{u_{2i} = \beta_0, u_{2i+1} = m\})\mu_{F_i}\mu_{B_i}\mu_{X_i},$$

$$\beta_0 \in \{0, 1\}$$

$$p(u_{2i+1} = \beta_1|Y) =$$

$$\eta_i \sum_{m \in \{0,1\}} \sum_{\zeta_i} \delta(\zeta_i\%4, \{u_{2i} = m, u_{2i+1} = \beta_1\})\mu_{F_i}\mu_{B_i}\mu_{X_i},$$

$$\beta_1 \in \{0, 1\} \text{ for } i = 0, \ldots, N-1$$

where $\eta_i$ is a normalization constant chosen such that the sum of a posteriori probabilities for a codeword symbol is equal to one.

Note that conventional RLL decoders provide hard decisions to a decoder for the outer code, whereas the disclosed soft RLL decoder provides soft information, thus enabling soft decoding of the outer code and iterative decoding, where soft information is fed back from the outer decoder to the inner decoder.

The soft-output of the RLL decoder represents information on the symbols of the codeword u, which is input to the LDPC decoder to obtain the message estimate $\hat{b}$, using the knowledge about the parity-check matrix H. It can be shown that the parity-check matrix H satisfies the following equation for all codewords of the LDPC code:

$$Hu=0 \quad (15)$$

where

H is the parity-check matrix of the LDPC code, and
u is any codeword of the LDPC code.

Figure 4:
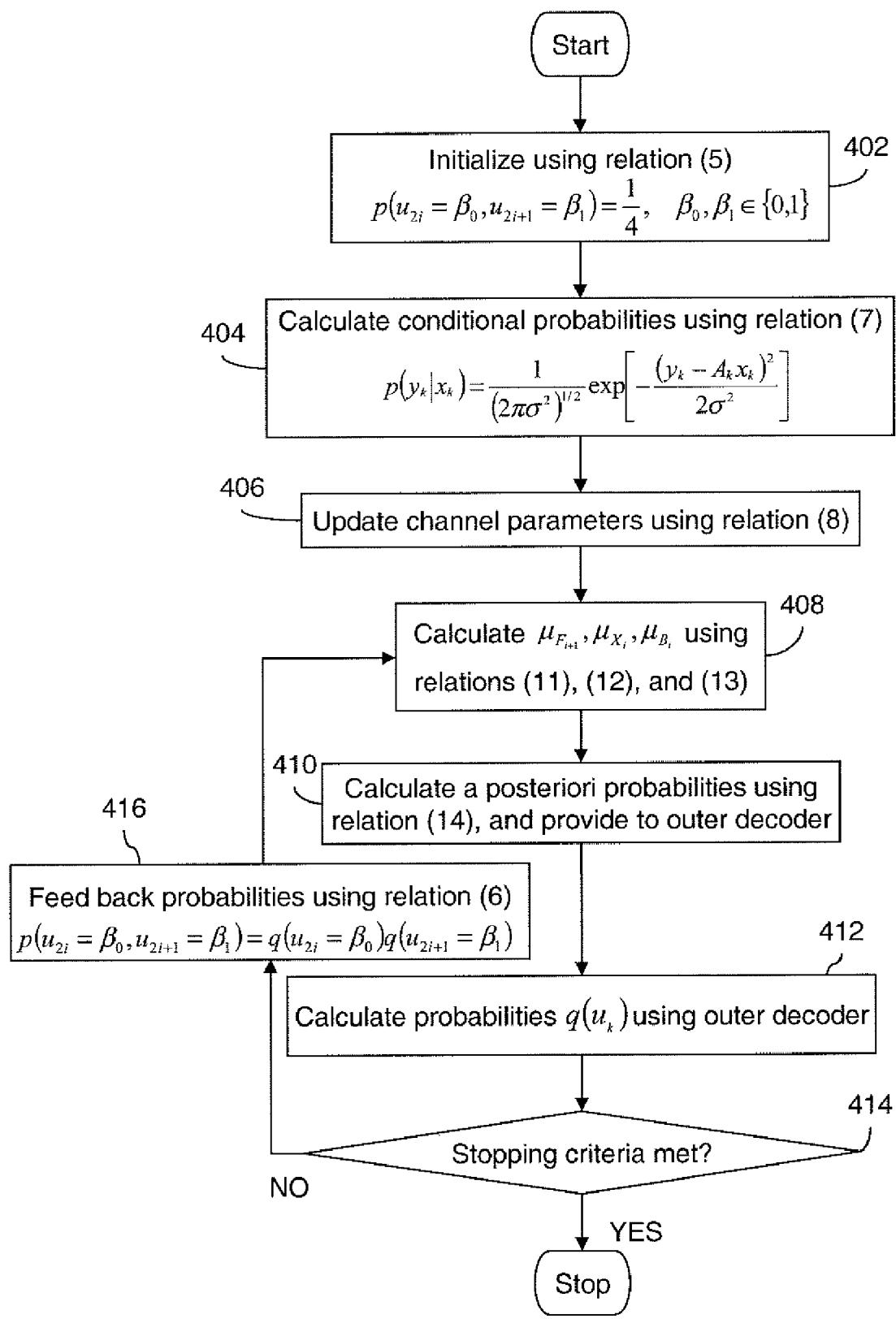
FIG. 4 is a flowchart depicting a method performing soft decoding of the RLL code using metric computation and parameter updating, in accordance with an embodiment of the present invention.

FIG. 4 is a flowchart depicting a method performing soft decoding of the RLL code using metric computation and parameter updating, in accordance with an embodiment of the present invention. The method initializes at 402 where initial probabilities for each of the four equi-probable combinations of codeword symbols at the $i^{th}$ stage $(u_{2i}, u_{2i+1})$ is set to $$\frac{1}{4}.$$

Then at 404, the method calculates the conditional probabilities $p(y_k|x_k)$ using relation (7). Further, at 406 the method updates the channel parameters using relation (8). Then at 408, the values of $\mu_{F_{i+1}}, \mu_{X_i}$, and $\mu_{B_i}$ are calculated using relations (11), (12), and (13) respectively.

At 410, the method calculates the a posteriori probabilities $p(u_k|Y)$ using relation (14). These a posteriori probabilities are fed to the outer decoder for decoding the error-correcting code. At 412, the outer decoder is used to calculate the probability distribution for the codeword symbols. Then at 414, the method checks if stopping criteria are met, and loops back to step 408 if the stopping criteria are not met. In an embodiment the stopping criterion is such that iterative decoding is halted if the outer decoder declares completion of the decoding of the outer code, or a preset number of iterations is reached. It would be apparent to a person skilled in the art that a variety of stopping criteria may be employed to terminate the iterative method presented in FIG. 4 without deviating from the spirit and scope of the present invention. Appropriate stopping criteria may be designed depending on factors including, but not limited to, the computational capacity and the acceptable read-back latency. If the stopping criteria are not met, the feedback from the outer decoder is used to update the probability distribution for the codeword symbols at the $i^{th}$ stage $(u_{2i}, u_{2i+1})$ using relation (6) at step 416.

The method described with reference to FIG. 4 uses relation (7) to compute the conditional probabilities, and relation (8) to update the channel parameters, to illustrate the functioning of the present invention with the help of an example. It would be apparent to a person skilled in the art that any channel parameter(s) may be considered to compute the conditional probabilities, and these channel parameters may be updated in a variety of ways, without deviating from the spirit and scope of the present invention.

Figure 5:
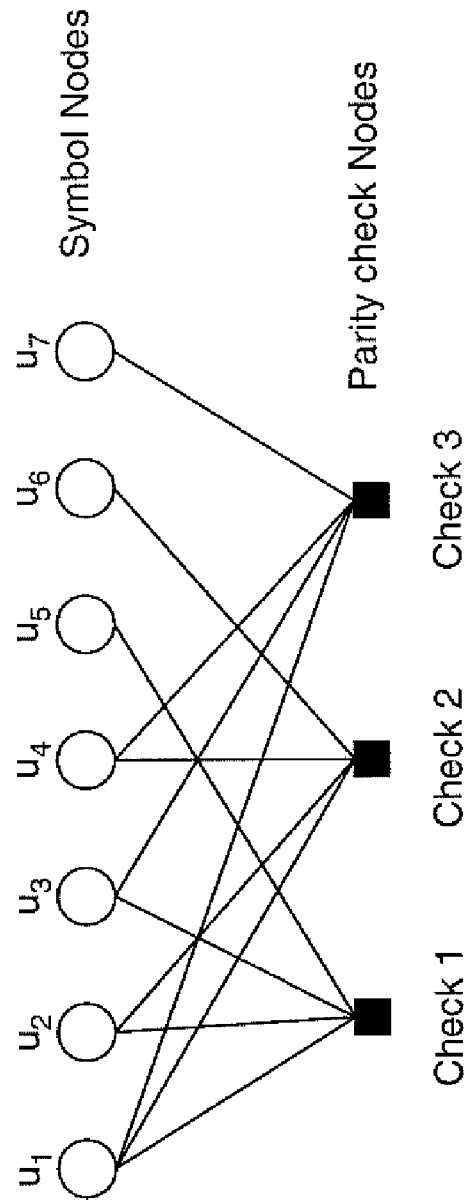
FIG. 5 depicts a graphical representation of a linear block code.

FIG. 5 depicts a graphical representation of a linear block code. Graphical representations of codes are useful for deriving and implementing iterative decoding procedures based on a sum-product algorithm. The graph in the figure represents the parity-check matrix H shown above it. The graph includes two types of nodes: the symbol nodes and the parity-check nodes (or check nodes). A symbol node n, representing code symbol $u_n$, is connected to check node m only if the (m,n)-th element of the parity-check matrix is equal to 1. No symbol node is connected to a symbol node, and no symbol check node is connected to a check node.

Figure 6:
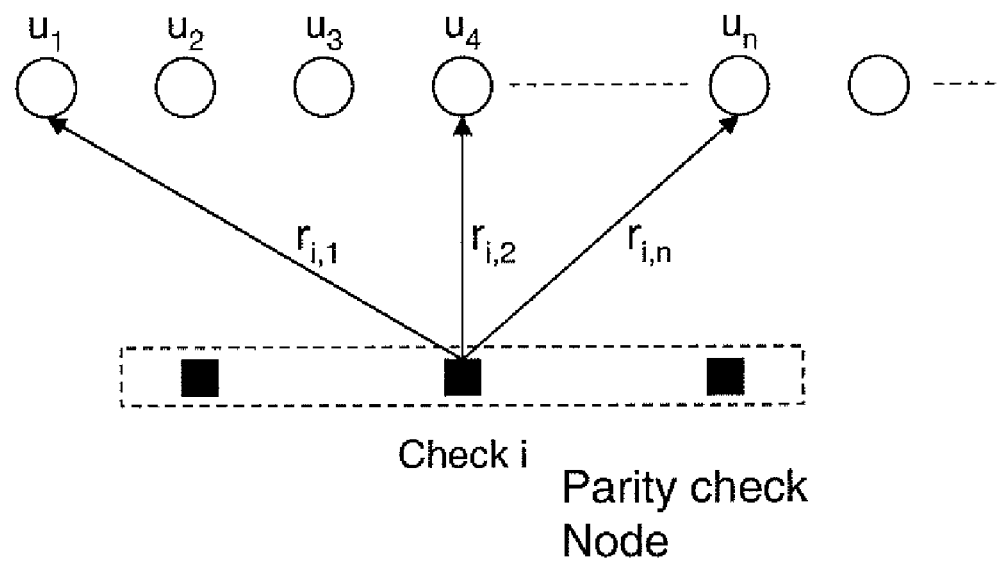
FIG. 6 shows a message-passing decoder based on the sum-product algorithm.
Figure 6:
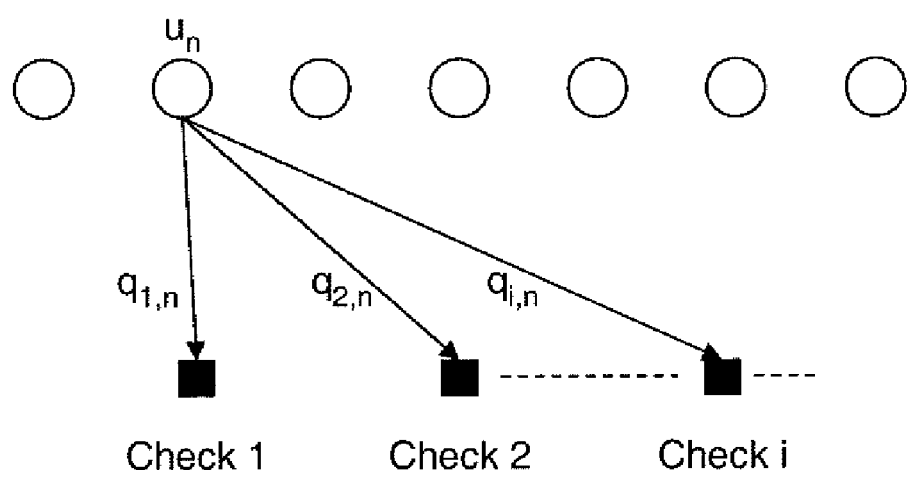

FIG. 6 shows a message-passing decoder for an LDPC code based on the sum-product algorithm. The decoder task is to recover message bits b given the vector of observables, usually given by the channel output signal samples. Note that in the present invention the observables are the a posteriori probabilities of the encoded symbols, which are obtained by soft decoding of the inner code, and are expressed as $\{p(u_i|Y), i=1,\ldots,n_0\}$. The LDPC decoder finds the most likely binary vector u such that:

$$Hu = s = 0 \quad (16)$$

where the vector s is known as the syndrome vector. Note that if the length of the vector b of message bits is equal to $k_0$ and the length of the codeword vector u is equal to $n_0$, then the number of parity check bits is given by $r_0 = n_0 - k_0$, which is also equal to the length of the syndrome vector s. The elements $s_i$, $i=1,\ldots,r_0$, of the vector s are called "checks". Then the aim is to compute the marginal a posteriori probabilities $$q_n(\beta) = P[u_n = \beta | \{p(u_i|Y), i=1,\ldots,n_0\}, s0],$$
$$\beta \in \{0,1\}, n=1,\ldots,n_0. \quad (17)$$

The detected codeword symbols will then be given by:

$$\hat{u}_n = \arg\max_{\beta \in \{0,1\}} q_n(\beta), \quad (18)$$
$$n = 1, \ldots, n_0,$$

from which the message estimate $\hat{b}$ is obtained.

The elements with indices (i,n) of the parity-check matrix H are defined as $H_{i,n}$. Let $L(i) = \{n: H_{i,n} = 1\}$, $i=1,\ldots,r_0$, be the set of the symbol nodes that participate in check with index i. Also, let $L(i)\backslash \tilde{n}$ be the set $L(i)$ from which the element with index $\tilde{n}$ has been removed. Similarly, let $M(n) = \{i: H_{i,n} = 1\}$, $n=1,\ldots,n_0$, be the set of the check nodes in which the symbol with index n participates.

The algorithm consists of two alternating steps, illustrated in FIG. 6, in which quantities $q_{i,n}^\beta$ and $r_{i,n}^\beta$ associated with each nonzero element of the matrix H are iteratively updated. The quantity $q_{i,n}^\beta$ denotes the probability that $u_n = \beta, \beta \in \{0,1\}$, given the information obtained via checks other than check i:

$$q_{i,n}^\beta = P[u_n = \beta | \{s_{i'} = 0, i' \in M(n)\backslash i\}, \{p(u_i|Y),$$
$$i=1,\ldots,n_0\}], n=1,\ldots,n_0. \quad (19)$$

Given $u_n = \beta, \beta \in \{0,1\}$, the quantity $r_{i,n}^\beta$ denotes the probability of check i being satisfied and the other bits having a known distribution given by the probabilities $\{q_{i,n'}^\beta : n' \in L(i)\backslash n, \beta \in \{0,1\}\}$:

$$r_{i,n}^\beta = P[s_i = 0, \{u_{n'}, n' \in L(i)\backslash n\} | u_n = \beta, \{p(u_i|Y),$$
$$i=1,\ldots,n_0\}], n=1,\ldots,n_0. \quad (20)$$

In the first step, the quantities $r_{i,n}^\beta$ associated with check node i are updated and passed as messages to the symbol nodes checked by check node i. This operation is performed for all check nodes. In the second step, quantities $q_{i,n}^\beta$ associated with symbol node n are updated and passed as messages to the check nodes that involve symbol node n. This operation is performed for all symbol nodes.

Figure 7:
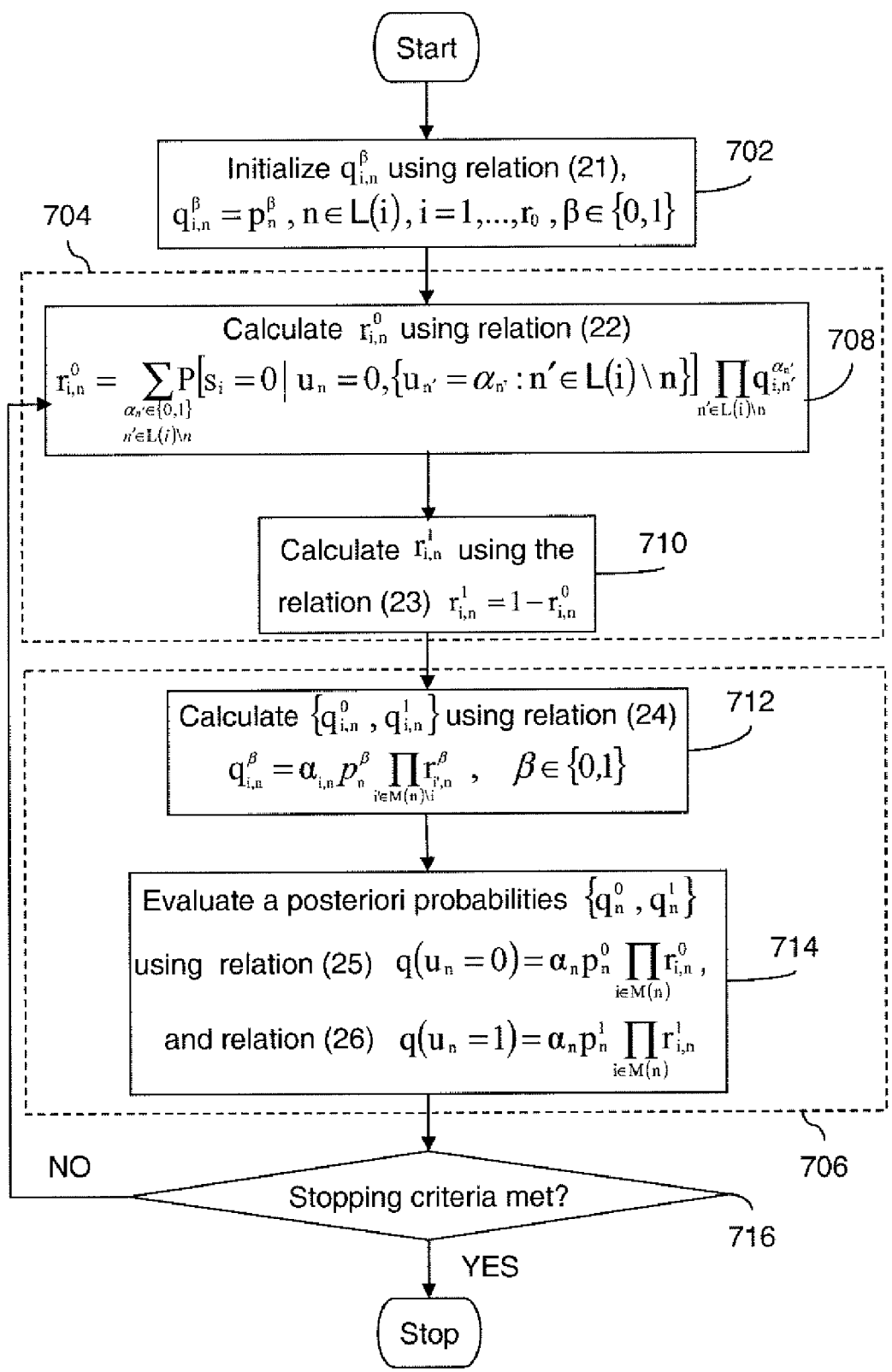
FIG. 7 is a flowchart depicting a method performing soft decoding of the LDPC code, in accordance with an embodiment of the present invention.

FIG. 7 is a flowchart depicting a method performing soft decoding of the LDPC code, in accordance with an embodiment of the present invention. The method comprises an initialization step 702 and two iterative steps, namely a first step 704 and a second step 706.

At step 702, $q_{i,n}^\beta, \beta \in \{0,1\}$ are initialized using the following relation:

$$q_{i,n}^\beta = p_n^\beta, n \in L(i), i=1,\ldots,r_0, \beta \in \{0,1\} \quad (21)$$

where the initial probabilities are obtained by soft decoding of the inner code:

$p_n^0 = p(u_n = 0|Y)$ denotes the probability that $u_n = 0$, and
$p_n^1 = p(u_n = 1|Y) = 1 - p_n^0$ denotes the probability that $u_n = 1$.

Then, at first step 704 the probabilities $\{r_{i,n}^0, r_{i,n}^1\}$ are computed. First step 704 comprises sub-steps 708 and 710. At 708, the method runs through the checks, and for the i-th check computes for each $n \in L(i)$ the probability $r_{i,n}^0$ that $s_i = 0$ when $u_n = 0$, given that the other bits $\{u_{n'}: n' \neq n\}$ have a distribution given by the probabilities $\{q_{i,n'}^0, q_{i,n'}^1\}$. This is done using the following relation:

$$r_{i,n}^0 = \sum_{\substack{\alpha_{n'} \in \{0,1\} \\ n' \in L(i)\backslash n}} P[s_i = 0 | u_n = 0, \{u_{n'} = \alpha_{n'}: n' \in L(i)\backslash n\}] \prod_{n' \in L(i)\backslash n} q_{i,n'}^{\alpha_{n'}} \quad (22)$$

At step 710, $r_{i,n}^1$ is computed using the relation:

$$r_{i,n}^1 = 1 - r_{i,n}^0 \quad (23)$$

The conditional probabilities in the above expression are either one or zero, depending on whether $s_i = 0$ or $s_i = 1$ is obtained for the hypothesized values of $u_n$ and $\{u_{n'}\}$.

In an alternative embodiment, the probabilities $\{r_{i,n}^0, r_{i,n}^1\}$ can be computed by applying the forward-backward algorithm to the computation of (22).

At second step 706, the probabilities $\{q_{i,n}^0, q_{i,n}^1\}$ are computed and the a posteriori probabilities $\{q_n^0, q_n^1\}$ are evaluated. Second step 706 comprises sub-steps 712 and 714. At step 712, the method updates the values of probabilities $\{q_{i,n}^0, q_{i,n}^1\}$ by performing a computation for each n using the following relation:

$$q_{i,n}^\beta = \alpha_{i,n} p_n^\beta \prod_{i' \in M(n)\backslash i} r_{i',n}^\beta, \quad (24)$$
$$\beta \in \{0, 1\}$$

where
$\alpha_{i,n}$ is a scaling factor chosen such that $q_{i,n}^0 + q_{i,n}^1 = 1$.

Then at step 714, the method takes into account the information $\{r_{i,n}^0, r_{i,n}^1\}$ from all check nodes, and evaluates the a posteriori probabilities $q_n^0$ and $q_n^1$ at this iteration using the following relations:

$$q_n^0 = q(u_n = 0) = \alpha_n p_n^0 \prod_{i \in M(n)} r_{i,n}^0 \quad (25)$$

$$q_n^1 = q(u_n = 1) = \alpha_n p_n^1 \prod_{i \in M(n)} r_{i,n}^1 \quad (26)$$

where
$\alpha_n$ is a scaling factor chosen such that $q_n^0 + q_n^1 = 1$.

First step 704 and second step 706 collectively comprise an iteration of the method. In various embodiments, the method computes a codeword estimate û by the logarithmic maximum a posteriori (log-MAP) criterion at each iteration using the following relation:

$$\hat{u}_n = \text{sgn} \ln \frac{q(u_n = 0)}{q(u_n = 1)}, \quad (27)$$

$$n = 1, \ldots, n_0.$$

Then at step 716, the method checks if stopping criteria are met, and loops back to step 708 if the stopping criteria are not met. In an embodiment, the stopping criterion is such that decoding is stopped if Hû=0. In another embodiment the stopping criterion is such that decoding is stopped if a maximum number of iterations is reached. It would be apparent to a person skilled in the art that a variety of stopping criteria may be employed to terminate the iterative method presented in this figure without deviating from the spirit and scope of the present invention. Appropriate stopping criteria may be designed for a decoder depending on factors including, but not limited to, the computational capacity and the acceptable read-back latency.

Further, in various embodiments, the messages $\{r_{i,n}^0, r_{i,n}^1\}$ and $\{q_{i,n}^0, q_{i,n}^1\}$ pa between the nodes need not be probabilities but can be likelihood or log-likelihood ratios.

An advantage of the present invention is that it provides a soft decoder for modulation codes that accounts for random channel impairments. Therefore, the decoder of the present invention produces fewer read-back errors than previously-proposed decoders. On the other hand, the error performance of previously-proposed decoders can be improved by increasing the number of states in the inner decoder. The decoder of the present invention achieves comparable error performance using less inner code states than previously-proposed decoders, thereby reducing complexity of the decoding process.

Various embodiments of the present invention may be implemented using an Application Specific Integrated Circuit (ASIC), reconfigurable hardware including but not limited to a Field Programmable Gate Array (FPGA), a Digital Signal Processing (DSP) processor, and/or a general purpose processor.

It will be apparent to a person skilled in the art that the principles of the present invention may be embodied in a variety of digital storage devices including but not limited to probe-based storage arrays, hard disks, optical storage devices such as Compact Disk (CD) and Digital Versatile Disk (DVD) readers, and the like. Various implementation approaches of the present invention have been discussed to illustrate, but not to limit, the present invention. It would be apparent to one skilled in the art that the selection of any of these approaches depends on the specific application of the present invention. Various other implementation approaches can be envisioned by one skilled in the art, without deviating from the spirit and scope of the present invention.

What is claimed is:

1. A method of data retrieval from a storage device, the method comprising:

obtaining samples of a read-back signal from the storage device;

computing conditional probabilities of the read-back signal samples using at least one recovered read-back channel parameter of the storage device;

performing decoding of a modulation code for data stored on the storage device using the conditional probabilities to obtain a posteriori probabilities; and performing decoding of an error-correcting code in which the data is is stored on the storage device using the posteriori probabilities to obtain an estimate of the recorded message.

2. The method of claim 1, further comprising providing feedback from decoding of the error-correcting code, wherein the feedback comprises refined a posteriori probabilities.

3. The method of claim 1, wherein the conditional probabilities are computed using recovered read-back channel parameters, and wherein the read-back channel parameters comprise at least one of random amplitude variations, jitter, and direct current (DC) offset.

4. The method of claim 1, further comprising computing a posteriori probabilities using the metric provided by the metric computation module.

5. The method of claim 3, wherein the a posteriori probabilities are computed using the following relations:

$$p(u_{2i} = \beta_0 | Y) = \eta_i \sum_{m \in \{0,1\}} \sum_{\zeta_i} \delta(\zeta_i \% 4, \{u_{2i} = \beta_0, u_{2i+1} = m\}) \mu_{F_i} \mu_{B_i} \mu_{X_i},$$

$$\beta_0 \in \{0, 1\}$$

$$p(u_{2i+1} = \beta_1 | Y) =$$

$$\eta_i \sum_{m \in \{0,1\}} \sum_{\zeta_i} \delta(\zeta_i \% 4, \{u_{2i} = m, u_{2i+1} = \beta_1\}) \mu_{F_i} \mu_{B_i} \mu_{X_i},$$

$$\beta_1 \in \{0, 1\} \text{ for } i = 0, \ldots, N-1$$

where $u_{2i}$ denotes the $(2i)^{th}$ symbol of the codeword u,
$u_{2i+1}$ denotes the $(2i+1)^{th}$ symbol of the codeword u,
Y denotes the sequence of read-back signal samples,
$\eta_i$ is a normalization constant,
$\zeta_i$ is a state variable where i=0, ..., N−1, and
$\mu_{F_i}, \mu_{B_i}, \mu_{X_i}$ are the probability messages propagated by the forward-backward algorithm.

6. The method of claim 1, wherein the modulation code is a run length limited (RLL0_) code.

7. The method of claim 1, wherein the error-correcting code is selected from a group consisting of low-density parity-check (LDPC) codes, and Reed-Solomon (RS) codes.

8. The method of claim 1, wherein the conditional probabilities are computed using the following relation:

$$p(y_k | x_k) = \frac{1}{(2\pi\sigma^2)^{1/2}} \exp\left[-\frac{\min(y_k - (x_k(A \pm \Delta A)z(\pm \Delta j) \pm \Delta h))^2}{2\sigma^2}\right]$$

where $Y_k$ is the read-back data,
$X_k$ is the hypothesized symbol input to the channel at the $k^{th}$ symbol interval,
σ is the standard deviation of an additive white Gaussian noise sample,
ΔA is the standard deviation of amplitude fluctuations around a nominal value A,
Δj is the standard deviation of jitter,
Δh is the standard deviation of DC offset.

* * * * *